United States Patent [19]
Yamamoto et al.

[11] Patent Number: 5,195,908
[45] Date of Patent: Mar. 23, 1993

[54] MULTICIRCUIT CABLE CONNECTOR

[75] Inventors: Tetsuo Yamamoto, Yokkaichi; Yasuharu Moriai, Suzuka; Kuniharu Kusumoto, Onna Atsugi; Morichika Yamamoto, Utsonomiya; Tetsuaki Wada, Inabe, all of Japan

[73] Assignee: Sumitomo Wiring Systems, Ltd., Japan

[21] Appl. No.: 759,844

[22] Filed: Sep. 13, 1991

Related U.S. Application Data

[63] Continuation of Ser. No. 561,272, Jul. 30, 1990, abandoned, which is a continuation of Ser. No. 374,477, Jun. 30, 1989, abandoned.

[30] Foreign Application Priority Data

Jun. 30, 1988 [JP] Japan ................. 63-165367

[51] Int. Cl.$^5$ ............................................. H01R 4/24
[52] U.S. Cl. .................................. 439/422; 439/507; 439/77
[58] Field of Search ............. 439/44, 47, 50, 55, 439/67, 77, 421–424, 492–499, 507

[56] References Cited

U.S. PATENT DOCUMENTS

| | | | |
|---|---|---|---|
| 3,715,457 | 2/1923 | Teagno et al. | 439/423 |
| 4,357,065 | 11/1982 | Kam et al. | 439/422 |
| 4,411,484 | 10/1983 | Casey | 439/422 |
| 4,492,419 | 11/1985 | Denckert | 439/44 |
| 4,551,579 | 11/1985 | Takasaki | 439/422 |
| 4,561,709 | 12/1985 | Fukukura | 439/423 |
| 4,655,551 | 4/1987 | Washizuka et al. | 439/67 |

FOREIGN PATENT DOCUMENTS 2014368  8/1979  United Kingdom ............... 439/77

Primary Examiner—David L. Pirlot
Attorney, Agent, or Firm—Jordan B. Bierman

[57] ABSTRACT

A multicircuit cable connector which includes a multicircuit, an insulation layer thereon, and a matching circuit which is placed on the layer. The multicircuit is a plurality of conductive strips which run along the length of the cable. The matching circuit is a means for interconnecting certain of the strips with one another and consists of interconnecting portions carrying terminals thereon. The interconnecting portions extend transversely of the cable and their length and location are determined by the arrangement of conductive strips in the cable and which of them are to be connected to each other. A U-shaped clip of generally channel shape is provided and the bottom thereof is pressed against a multicircuit conductor and the sides extend through the layer and are crimped onto the terminals on the interconnecting portions of the matching circuit, thereby completing the connection.

17 Claims, 4 Drawing Sheets

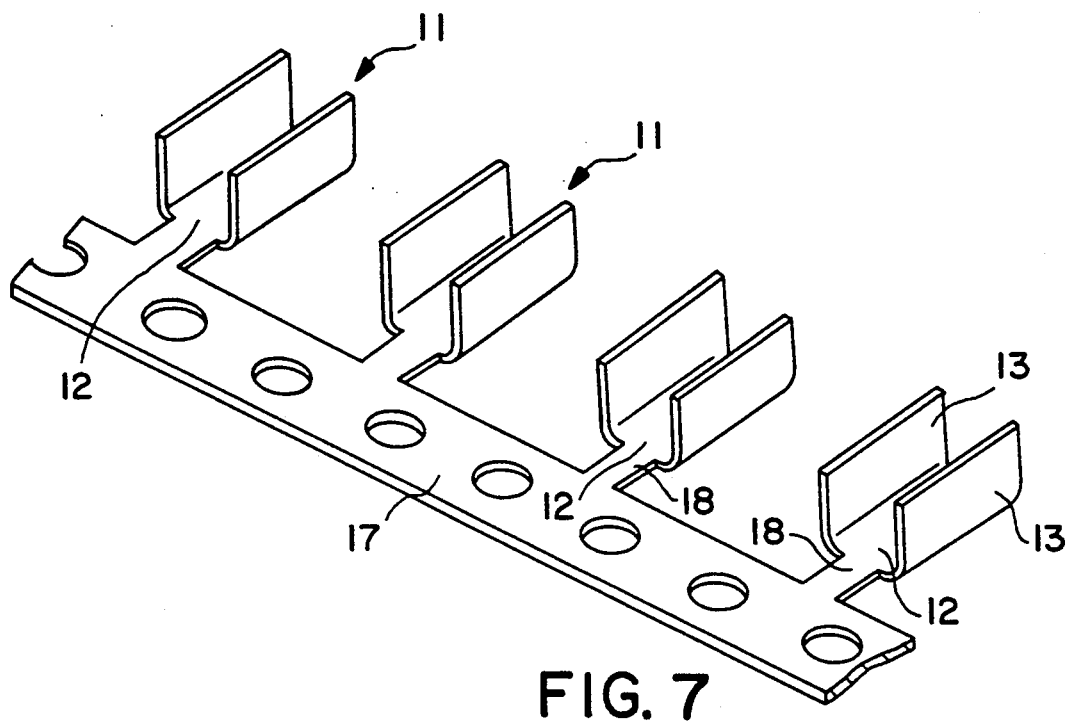
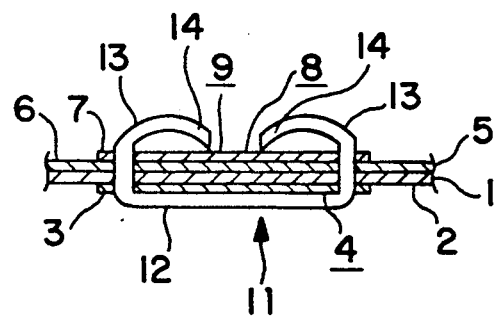

MULTICIRCUIT CABLE CONNECTOR

This application is a continuation of application number 07/561272, filed Jul. 30, 1990, now abandoned, which is a continuation of application Ser. No. 07/374,477, filed Jun. 30, 1989, now abandoned.

This application claims the priority of Japanese Application 165,367/1988, filed Jun. 30, 1988.

The present application is directed to a device for making electrical connections between various circuits of a multi-conductor flexible printed circuit; in particular, a device for use wherein a group of substantially parallel strips of electrical circuits are formed on one or both sides of an insulating substrate.

BACKGROUND OF THE INVENTION

Flexible cable comprises printed circuits and/or flat multi conductor cables wherein the conductive circuit is formed on either or both sides of a flexible sheet or film of insulating material. There are a number of methods which are generally known for connecting the conductive strips of such a flexible cable for use in the situation in which interfaces with printed circuit boards are appropriate. Reference is made to page 102 of "Printed Circuit, Design and Drafting" by J. S. Cook II (TAD Institute, Cambridge, Mass., Published in 1967 by Associated Designers, Inc.) wherein three basic methods for making such connections are described. They are (1) a wire lead, (2) a flared eyelet, and (3) a plated through hole.

Wire lead connections remain widely used and consist of direct soldering of the lead to the cable conductor. As can readily be seen, the substrate is exposed to substantial heat and resultant deformation of the circuit can easily occur.

The flared eyelet is an improvement on the foregoing, and a reliable interconnection is normally achieved. However, this method uses an eyelet made of silver having a unique structure. This increases the cost and diminishes the productivity of the final product.

A plated through hole is an extremely desirable form of interconnection, especially between two circuit patterns which are formed on both sides of an insulating substrate. In present day electronic packaging practice, especially for a high density electronic device where signal circuits predominate in the package, the plated through hole system is virtually essential for suitable interconnection.

U.S. Pat. Nos. 4,429,303 and 4,249,304 (both to Weinmann, et al) describe connectors of this general type. In '303, there is set forth a method for connection of flat cables which selects the connection zone by reference to a matrix of connection zones provided by placing one flat cable on top of the other. In '304, there is found a method of connecting such cables through perforations in the overlapping cable portions followed by insertion of a connector through the perforation. This is followed by electrically connecting the connector to each of the overlapping conductors. Since the conductor is inserted through an opening, there is no need to provide it with a sharp edge or make it strong enough to pierce the conductors and/or the substrates.

U.S. Pat. No. 3,395,381 (Huffnagle) describes a crimpable U-shaped connecting device. In accordance with that reference, the conductor is pinched between the lances and the edges of the inwardly bent side walls.

DESCRIPTION OF THE PRESENT INVENTION

It is among the objects of the present invention to provide a reliable connection between specified circuits in a flexible cable by the use of a flexible connector which overlaps the cable with an insulating layer therebetween. Specific clips are used to actually make the electrical connections as desired.

It is a more specific object of the present invention to provide a device for connecting flexible printed circuits with a multi-conductor cable wherein the latter comprises a series of parallel conductors on one or both sides of an insulating material. Generally, the connecting circuit will have the same number of terminals as there are conductors in the cable. The circuit will also have interconnective portions which overlap the flexible circuits so that each circuit terminal is placed on top of its mating conductor in the printed circuit and the interconnective portions are transverse to the parallel conductors.

The present invention has substantial advantages over the prior art. More specifically, it can be easily manufactured by conventional methods and a suitable connecting circuit is designed merely by comparison with that of the flexible cable. It is of particular advantage in practicing the present invention to design the circuits so that the terminals of the connecting circuits are aligned along a line which is perpendicular to the longitudinal conductors in the cable. This permits connection by machine using only simple processes; perforation, insertion of the clips, and compression.

Therefore, in practicing the present invention, the cable connector comprises a multicircuit of a flexible cable, an insulation layer on the circuit, and a second circuit on the layer and complementary to the multicircuit.

The latter consists of a plurality of conductive strips which are substantially parallel to each other and extend in a longitudinal direction. The second circuit is made up of interconnecting portions and terminals connected thereto. Each of the interconnecting portions extends between at least two terminals.

The second circuit is superposed on the insulation layer and may be adhered or bonded thereto. At this point, the multicircuit and the second circuit are in the appropriate position for connection, but no actual connection has been made. This is accomplished by the use of a plurality of substantially U-shaped clips. The bottom of each of the clips is pressed against one of the longitudinal conductors or strips making up the multicircuit. The upstanding sides pass through the insulation layer and are bent inwardly so as to contact an appropriate terminal which is attached to the interconnecting portions of the second circuit.

Since the multicircuit has a substantial number of strips or conductors therein, appropriate design of the interconnecting portions will enable any two or more of these strips to be connected to one another. It is within the scope of this invention to provide three or more terminals on a single interconnecting portion so that three such strips can be connected to one another and/or another element.

In a preferred form of the invention, the second circuit is also on an insulating substrate and the substrate and the insulation layer are superposed on one another to form a combined insulator. Thus, the second or connecting circuit is on one side of the combined insulator and the multicircuit is on the other. The combined insulator can be formed by bonding, fusing, adhesives, or mechanical connection.

In one embodiment of the present invention, the insulating layer or combined insulator is provided with openings passing therethrough for the introduction of the sides of the clips. Also, the edges of the clips remote from their bottoms are sharpened so that they can cut through the insulating layer or combined insulator and/or dig into the terminals and thereby provide excellent contact.

A further modification of the present invention provides upstanding wedges in the bottoms of the clips. These can be struck up from the metal of the bottom itself, or otherwise affixed or formed. In essence, when the clip is pressed against the multiconductor, the wedges dig into the strip and improve the electrical contact.

A further embodiment of the clips provides that the ends thereof taper inwardly from the bottom toward the edges. It has been found that this feature assists the sharpened edges in making excellent contact with the second circuit terminals.

BRIEF DESCRIPTION OF THE DRAWINGS

In the accompanying drawings, constituting a part hereof, and in which like reference characters indicate like parts.

FIG. 7 is a perspective view showing the clips of the present invention during their manufacture; and FIG. 8 is a cross-sectional view along line VIII—VIII of FIG. 1.

DETAILED DESCPITION OF THE INVENTION

Figure 1:
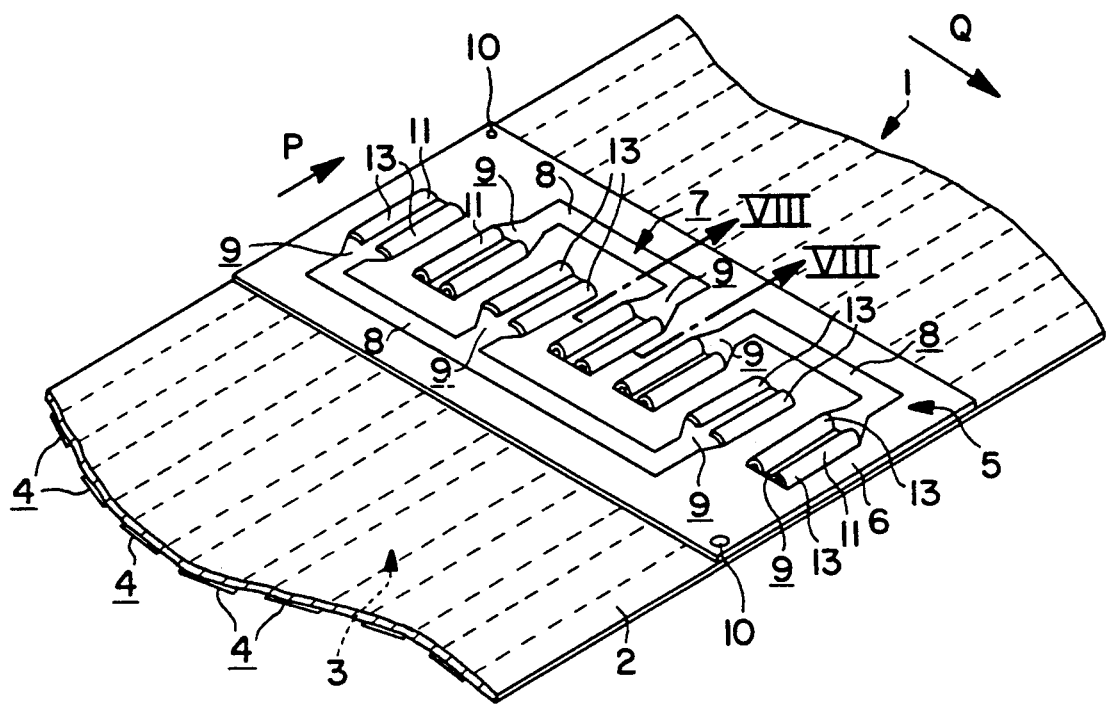
FIG. 1 is a perspective schematic view of the connector of the present invention.
Figure 2:
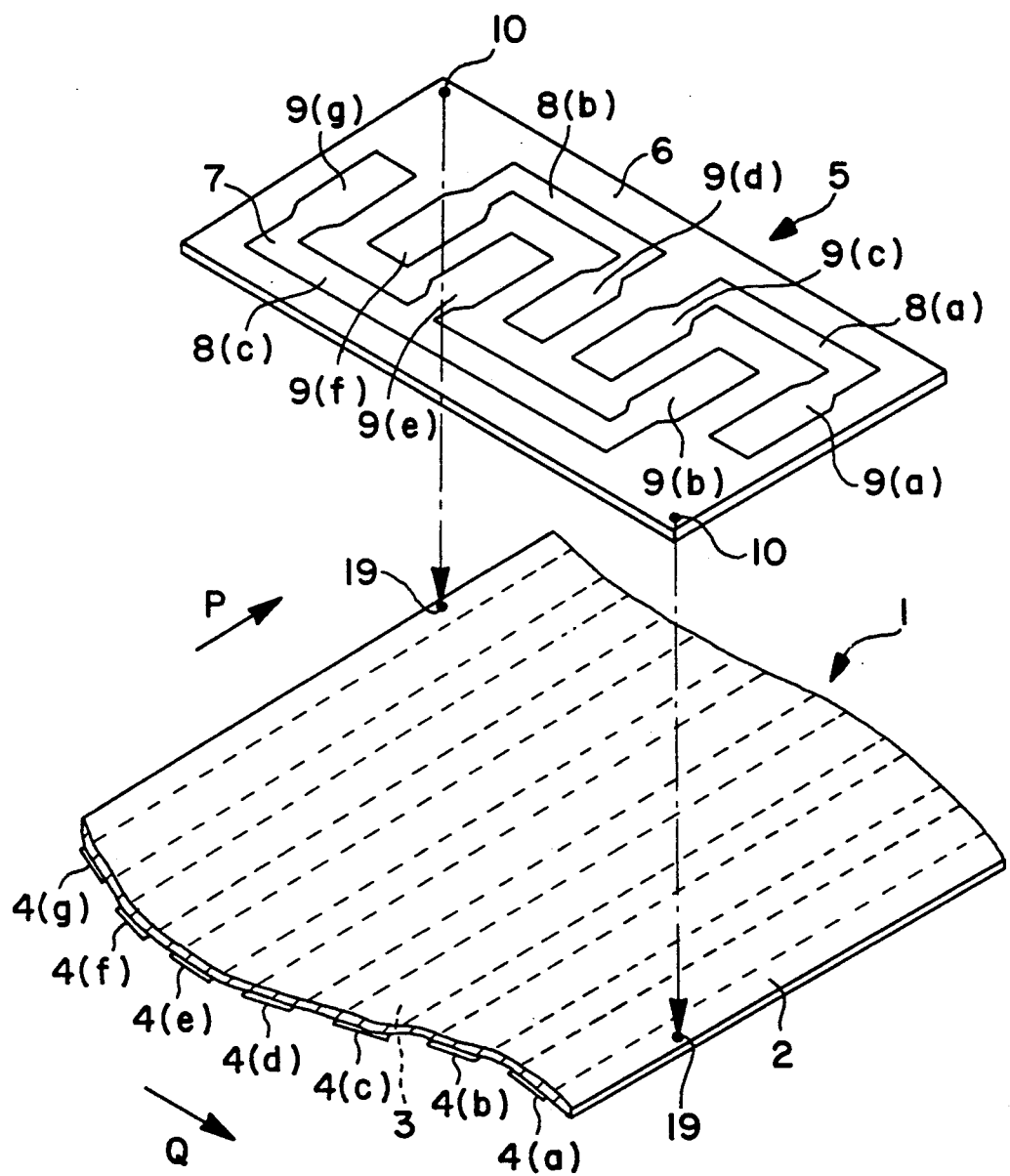
FIG. 2 is an exploded schematic view similar to that of FIG. 1.
Figure 3:
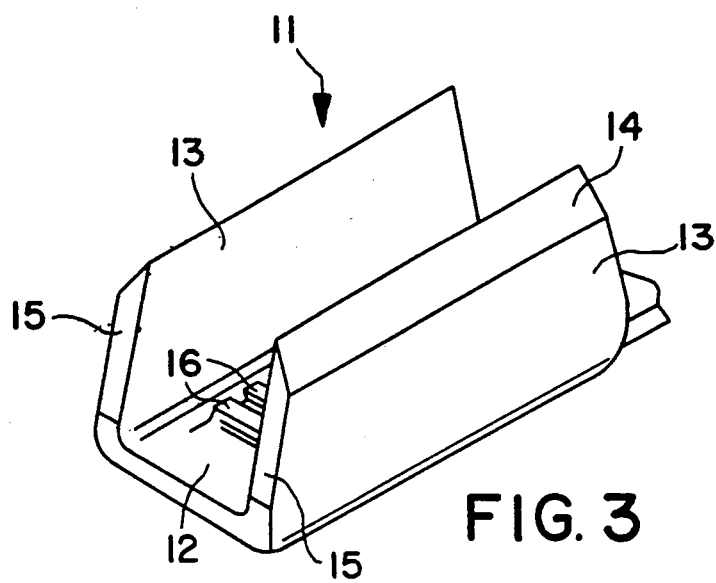
FIG. 3 is a perspective view of the clip which connects the multicircuit with the second circuit.
Figure 4:
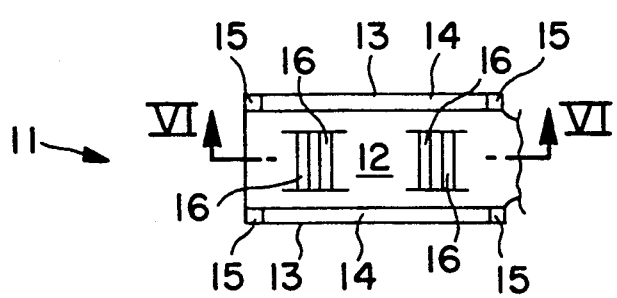
FIG. 4 is a schematic plan view of the clip of FIG. 3.
Figure 5:
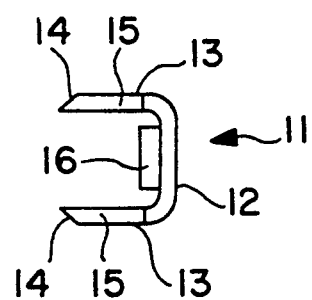
FIG. 5 is a side view of the clip of FIG. 4.
Figure 6:
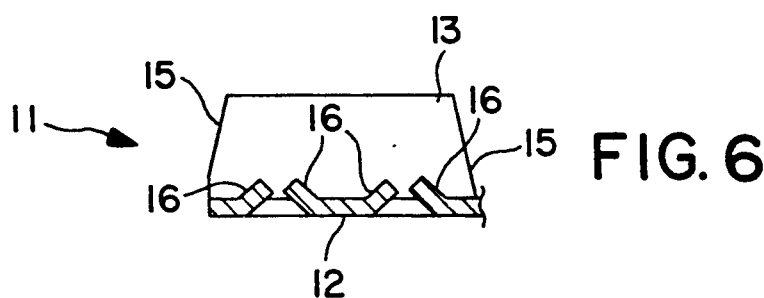
FIG. 6 is a schematic view, partly in section, along line VI—VI of FIG. 4.

Referring more specifically to FIGS. 1 and 2, flexible cable 1 comprises insulation layer 2 and multicircuit 3 which is made up of a plurality of conductive strips 4.

Matching conductor 5 comprises insulating substrate 6 and matching circuit 7 which includes interconnecting portions 8 and terminals 9. In order to locate matching connector 5 properly with respect to flexible cable 1, locator openings 10 and locator holes 19 are provided in insulating substrate 6 and insulation layer 2, respectively.

As shown in FIGS. 3 to 6, clip 11 comprises bottom 12 and upstanding sides 13. The latter are provided with sharpened edges 14 and tapered ends 15. Wedges 16 are struck up from bottom 12 as particularly shown in FIG. 6. Edges 14, ends 15, and wedges 16 all contribute to making good electrical contacts between the selected strips 4 and the corresponding terminals 9.

An intermediate stage in the manufacture of clips 11 is shown in FIG. 7. At this point, they remain attached to lead 17 by necks 18. After the various bending and striking operations are concluded, clips 11 are separated from lead 17 by severing them at the ends of necks 18 immediately adjacent bottoms 12 and sides 13.

In assembling the cable connector according to the present invention, matching connector 5 is placed atop flexible cable 1. The former carries interconnecting portions 8 and terminals 9. More specifically, portion 8(a) connects terminals 9(a) and 9(c). Portion 8(c) connects terminals 9(b) and 9(g) and, in addition, also carries intermediate terminal 9(e). In similar fashion, portion 8(b) connects terminals 9(d) and 9(f). Terminals 9(a) through (g) are each located so as to overlie the corresponding strips 4(a) through 4(g).

Locator openings 10 are bored in insulating substrate 6 and corresponding holes 19 are made in insulation layer 2. A suitable pin or the like (not shown) passes through each pair of holes 10 and 19 to fix matching connector in proper position with relation to flexible cable 1. If desired, holes can be formed in both layer 2 and substrate 6 through which clips 11 can pass. However, this is not essential.

Once matching connector 5 is in place, bottom 12 of clip 11 is pressed against the surface of, for example strip 4(b). Sides 13 then project (or are forced) through layer 2 and substrate 6 to project upwardly on either side of terminal 9(b). Thereafter, edges 14 are bent inwardly to make contact with terminal 9(b) and complete the connecting process. This is shown clearly in FIG. 8.

The same process is repeated for strips 4(b), 4(e), and 4(g) in relation to terminals 9(b), 9(e), and 9(g). Thus, strips 4(b), 4(e), and 4(g) are interconnected through portion 8(c). The remaining connections are made in like manner.

As can readily be seen from the foregoing, the pattern of matching circuit 7 is based upon which of strips 4(a) to (g) are to be connected to each other, as well as the number and spacing of strips 4. However, the manufacture and connection of the device is extremely simple and virtually foolproof.

Although only a limited number of embodiments of the present invention have been specifically disclosed, it is, nonetheless, to be broadly construed, and not to be limited except by the character of the claims appended hereto.

What is claim is:

1. A method of making electrical connections between continuous conductive strips of multicircuit cable, said cable comprising a plurality of said conductive strips extending substantially parallel to each other in a longitudinal direction with an insulation layer, said method comprising;

laying a matching circuit over or under said multicircuit cable, said matching circuit comprising a plurality of terminals corresponding to said plurality of conductive strips, and interconnecting portions which connect said plurality of terminals whereby at least a first terminal is connected to each of a plurality of other terminals, pushing a first substantially U-shaped conductive clip having a bottom and upstanding sides through said insulation from a side opposite that of said matching circuit, said upstanding sides piercing said insulation and establishing electrical contact with said first terminal of said matching circuit, said bottom establishing electrical contact with a corresponding first conductive strip, pushing at least a second U-shaped clip through said insulation from the same side as said first clip, said upstanding sides of said second clip establishing electrical contact with a second terminal of a plurality of remaining interconnected terminals of said matching circuit, said second terminal being one of a plurality of terminals connected to said first terminal by an interconnecting portion on said matching circuit, the bottom of said second clip establishing electrical contact with a second conductive strip corresponding to said second terminal.

2. The method of claim 1 wherein said sides are bent toward each other and contact said terminals at their edges which are remote from said bottom.

3. The method of claim 1 wherein there are edges on said sides remote from said bottom and ends on said sides at the extremes thereof and extending from said bottom to said edges, said ends being tapered from said bottom toward said edges.

4. The method of claim 1 wherein there are a plurality of holes through said insulation layer through which said sides extend.

5. The method of claim 1 wherein said terminals are substantially parallel to and at least partially overlie said strips.

6. The method of claim 1 wherein there are openings in said insulating layer and said substrate which are in register with each other when said layer and said substrate are properly aligned with each other.

7. The method of claim 1 wherein said matching circuit is on an insulating substrate which is between said matching circuit and said insulation layer.

8. The method of claim 7 wherein said substrate is bonded to said insulation layer.

9. The method of claim 1 wherein at least one of said first clip and said second clip has sharpened edges on said sides and remote from said bottom.

10. The method of claim 9 wherein at least one of said first clip and said second clip has at least one wedge in its bottom, said wedge extending toward said edges.

11. The method of claim 9 wherein all said edges are sharpened.

12. The method of claim 1 wherein said interconnecting portions are substantially transverse to said longitudinal direction.

13. The method of claim 12 wherein said terminals are substantially parallel to and at least partially overlie said strips.

14. The method of claim 12 wherein said terminals are substantially parallel to and at least partially overlie said strips, said matching circuits on an insulating substrate which is between said layer and said matching circuit and which is fused to said layer, said first clip and said second clip have sharpened edges on said sides remote from said bottom, said bottom has a wedge therein extending toward said edges, said sides have ends at the extremes thereof extending from said bottom to said edges, said ends being tapered from said bottom toward said edges, a plurality of holes in said layer and said substrate through which said sides extend, said layer and said substrate being of the same material, said sides being bent toward each other whereby said edges contact said terminals.

15. The method of claim 7 wherein said insulating layer and said substrate are of the same material.

16. The method of claim 15 wherein said insulating layer and said substrate are fused together.

17. The method of claim 15 wherein said insulating layer and said substrate are held together by adhesive.

* * * * *